(12) United States Patent
Kim

(10) Patent No.: US 6,441,493 B1
(45) Date of Patent: Aug. 27, 2002

(54) CIRCUIT BOARD HAVING INTERCONNECTION BALL LANDS AND BALL GRID ARRAY (BGA) PACKAGE USING THE CIRCUIT BOARD

(75) Inventor: Hyeong-Scob Kim, Chungcheongnam-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/955,245

(22) Filed: Sep. 17, 2001

(30) Foreign Application Priority Data

Sep. 26, 2000 (KR) .......................... 2000-56368

(51) Int. Cl.[7] .......................... H01L 23/48; H01L 23/52
(52) U.S. Cl. .................. 257/773; 257/698; 257/737; 257/747; 257/780; 257/781
(58) Field of Search ................ 257/773, 698, 257/780, 781, 737, 738, 747

(56) References Cited

U.S. PATENT DOCUMENTS

| | | | |
|---|---|---|---|
| 5,706,178 A | 1/1998 | Barrow | 361/777 |
| 5,796,163 A | 8/1998 | Glenn et al. | 257/698 |
| 5,875,102 A | 2/1999 | Barrow | 361/777 |
| 5,936,848 A | 8/1999 | Mehr et al. | 361/777 |
| 6,028,366 A | 2/2000 | Abe | 257/779 |
| 6,268,568 B1 * | 7/2001 | Kimn | 174/250 |

* cited by examiner

Primary Examiner—Hoai Ho
Assistant Examiner—Tu-Tu Ho
(74) Attorney, Agent, or Firm—Marger Jonhson & McCollom, P.C.

(57) ABSTRACT

A circuit board and a ball grid array (BGA) package having a solder joint with improved reliability are disclosed. The circuit board has a chip mounting surface in which wiring patterns are formed and a solder ball mounting surface in which a plurality of solder balls are mounted and electrically interconnected to the wiring patterns. The circuit board comprises a plurality of ball lands connected to the solder balls. The circuit board further includes solder ball opening area defined by a solder ball mask on the solder ball mounting surface and exposing the ball land from the solder ball mask, a plurality of pattern connecting portions each connected to corresponding one of the ball lands, and conductive wiring patterns linked together with the pattern connecting portions and electrically interconnected to the solder balls. The plurality of pattern connecting portions are aligned radially inwardly toward substantially a center point of the solder ball mounting surface.

16 Claims, 6 Drawing Sheets

CIRCUIT BOARD HAVING INTERCONNECTION BALL LANDS AND BALL GRID ARRAY (BGA) PACKAGE USING THE CIRCUIT BOARD

BACKGROUND OF THE INVENTION

1. Field of the Invention

This invention relates to semiconductor packaging technology and, more particularly, to a BGA (Ball Grid Array) package.

2. Description of Related Art

As higher performance, more reliable, smaller and lighter IC devices are increasingly required, demands for smaller component packages and higher input/output (I/O) pin counts are increasing in the semiconductor packaging industry. The QFP (Quad Flat Package) and the BGA (Ball Grid Array) package offer a large number of I/O pins, as required by modem IC technology. In order to accommodate the increasing number of I/O pins, the QFP technology is forced to an ever finer lead pitch, which results in increasingly thinner, more fragile leads. Accordingly, the BGA package is more proper for a high I/O pin-count requirement while keeping the overall size of the package device smaller, using a far coarser pitch and more-freely-designed interconnections. The BGA package is an area array package that utilizes whole or part of the device footprint for interconnections made of balls composed of a conductive material such as a solder alloy. The BGA package is advantageous in that it can obtain the chip scale or chip size package (CSP) by reducing the package size by more than 30 percent of the normal lead frame plastic package and make the ball pitch less than 1.00 mm.

In a BGA package, reliability is important, in particulars the reliability of the solder joint, e.g., the joint between the solder ball and the ball land, is critical. When the solder joint is disconnected, electrical path is disconnected, resulting in undesirable device failure. Further, if cracks occur in the solder joint, electrical resistance in the joint increases and thus electrical characteristics of the device cannot be assured. The increase of the resistance in the joint produces an unwanted DC voltage drop in the signal path and may cause a charging delay in RC circuits and noise in system level.

Several attempts have been made to strengthen the joint between the solder balls and ball lands. One such example is disclosed in U.S. Pat. No. 5,796,163, in which a metal-to-metal annular bond is formed at the joint between the solder ball and the land around the plug of nonconductive material in the center of a via. Such a technology is also disclosed in U.S. Pat. No. 5,875,102, U.S. Pat. No. 5,936,848 and U.S. Pat. No. 5,706,178.

In U.S. Pat. No. 5,875,102, each via hole has a portion located within a solder pad to increase the routing space of the substrate, and additionally a portion located outside the solder pad to allow outgassing from the via hole. U.S. Pat. No. 5,936,848 discloses a technology using a plug via hole, while U.S. Pat. No. 5,706,178 describes a via hole structure formed within the solder ball land. Additionally, in U.S. Pat. No. 5,872,399, a dimple is formed in the solder ball land, and in U.S. Pat. No. 6,028,366, a groove is formed in the ball land. The purpose of both methods is to increase the joint strength between the solder ball and the ball land.

However, these conventional methods have not been fully successful in achieving a level of package reliability that is required by recent integrated circuit technology.

SUMMARY OF THE INVENTION

It is, therefore, an object of this invention to improve the package reliability, e.g. the reliability of the joints between solder balls and ball lands.

It is another object of this invention to prevent cracking from occurring in the joints between the solder balls and the ball lands.

Figure 2:
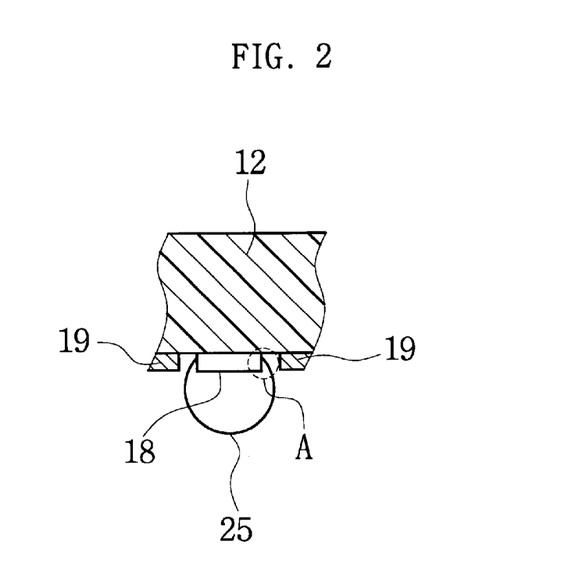
FIG. 2 is a partial enlarged view showing the relationship between the defect in the solder ball joint and the direction of applied stress in the BGA package.

For the purposes of the present invention, the inventors focus on the fact that the reliability of the BGA package largely depends on the package pad design. After reviewing and analyzing the causes of the cracks in the joints, the inventors discovered that the joint cracks occur in a direction to which a stress is applied. The inventors recognized that when a stress is applied to the joint in an arrow direction as shown in FIG. 2, the circle denoted as 'A' in the joint, i.e., the initial stressed portion of the joint is most susceptible to cracking. The stress may be applied, for example, because of a mismatch between the coefficient of thermal expansion (CTE) between the substrate 12 and the semiconductor chip 20 during thermal cycling in the reliability test of the package. In the reliability test, the package is subjected to heat and then cooled in room temperature.

According to the present invention, a circuit board has a chip mounting surface in which wiring patterns are formed and a solder ball mounting surface in which a plurality of solder balls are mounted and electrically interconnected to the wiring patterns. The circuit board comprises a plurality of ball lands each directly connected to the respective one of the solder balls; a older ball opening area defined by a solder ball mask generally deposited on the solder ball mounting surface and exposing the ball land from the solder ball mask; a plurality of pattern connecting portions each connected to corresponding one of the ball lands; and conductive wiring patterns linked together with the pattern connecting portions and electrically interconnected to the solder balls. The plurality of pattern connecting portions are arranged toward a center point of the solder ball mounting surface.

In an aspect of the present invention, a ball grid array package comprises the circuit board having centrally directional solder ball land types. The BGA package is a NSMD (non-solder mask defined) structure in that the size of the ball land is smaller than the ball land opening area.

These and other features, and advantages, will be more clearly understood from the following detailed description taken in conjunction with the accompanying drawings. It is important to point out that the illustrations may not necessarily be drawn to scale, and that there may be other embodiments of this invention which are not specifically illustrated.

DETAILED DESCRIPTION OF PREFERRED EMBODIMENTS

Figure 1:
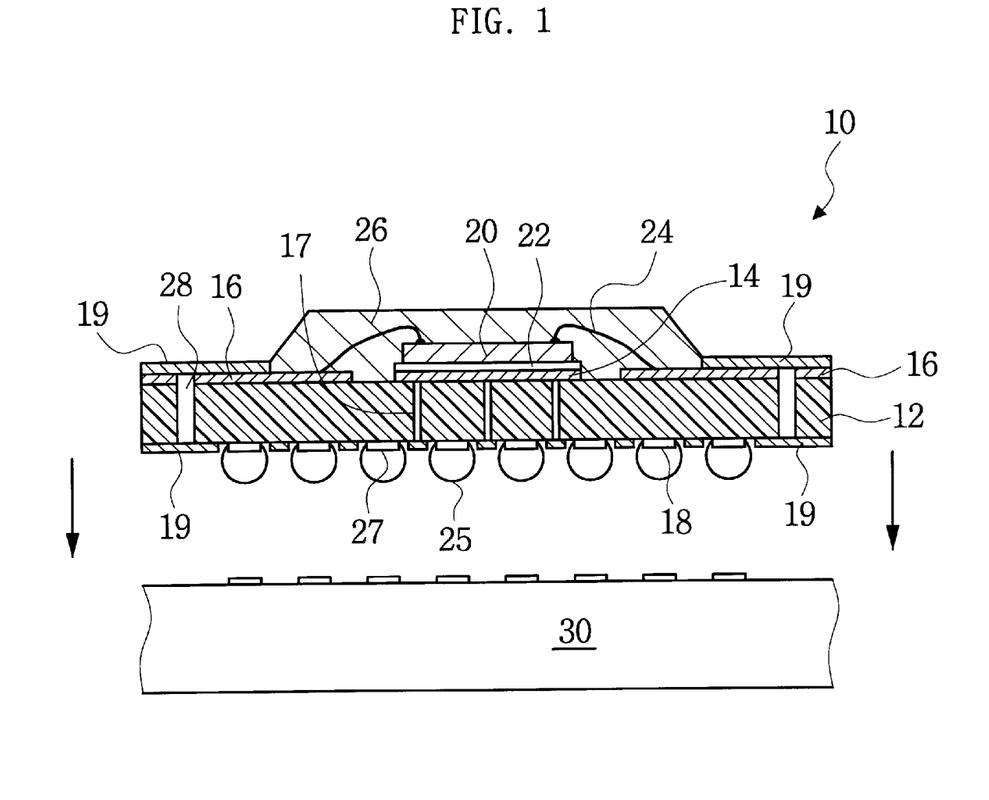
FIG. 1 is a cross sectional view showing a BGA package and a circuit board mounting the BGA package according to one embodiment of the present invention.

FIG. 1 shows a BGA package and a circuit board on which the BGA package is mounted in accordance with a preferred embodiment of the present invention. The package shown in FIG. 1 is a plastic package that employs over-molding and wire bonding technologies. However, it should be noted that the present invention is not limited to such a plastic package. Those skilled in the art should appreciate that the present invention can be applied to a TAB tape package using polyimide tape and Sn—Pb alloy (e.g., 10 percent of tin and 90 percent of lead) and a metal lid package as well as a ceramic package.

The BGA package device 10 includes a substrate 12, a semiconductor chip 20 and solder balls 25. The substrate 12 is formed of an organic material, e.g., BT (Bismaleimide-Triazine) resin or epoxy glass (also referred to as 'FR-4'). On a chip mounting surface of the substrate 12 are disposed a die pad 14, a conductive wiring, e.g. metal wiring 16 and a solder mask 19, while the bottom surface or solder ball mounting surface 50 (FIG. 3) of the substrate 12 are provided with an interconnection ball land 18 and the solder mask 19. The die pad 14 and the metal wiring 16 are conductive patterns, e.g., copper patterns, formed by a photolithography technology. When required input and output (I/O) pins are relatively few, the metal wiring (metal pattern) 16 is formed on both sides of the substrate 12. In case of high I/O pin counts, the metal pattern 16 may be formed on the inner layer of the substrate as well as on both sides of the substrate. The semiconductor chip 20 is attached to the die pad 14 using a conductive adhesive 22, e.g., a silver filled epoxy or a silver filled glass adhesive. The semiconductor chip and the metal wiring 16 are electrically interconnected by a conductive wire, e.g., metal wire 24. The wiring pattern 16 on the chip mounting surface may extend to the bottom surface through via holes 28. Heat generated from the chip 20 can be dissipated through thermal via holes 17. The ball land 18 is surrounded by the solder mask 19. By placing the solder balls 25 onto the ball land 18 and then performing reflow soldering, the solder balls 25 are soldered to the land 18. At this time, a solder ball joint 27 is formed by the joint, e.g. metal-to-metal, between the solder ball 25 and the ball land 18. The semiconductor chip 20 and metal wiring 16 are protected by an encapsulant such as a plastic resin 26 to form a package body.

The BGA package 10 is mounted onto a circuit board 30 (for example, a module board consisting of a memory module) by surface mounting the package so that the solder all 25 is soldered to the conductive pad 32. The reliability of the solder ball joint 27 is affected by the design of the conductive pad 32. However, the effect of the conductive pad design is less significant than the solder ball land type (i.e., design of ball land and conductive wiring) in view of the semiconductor package.

Figure 3:
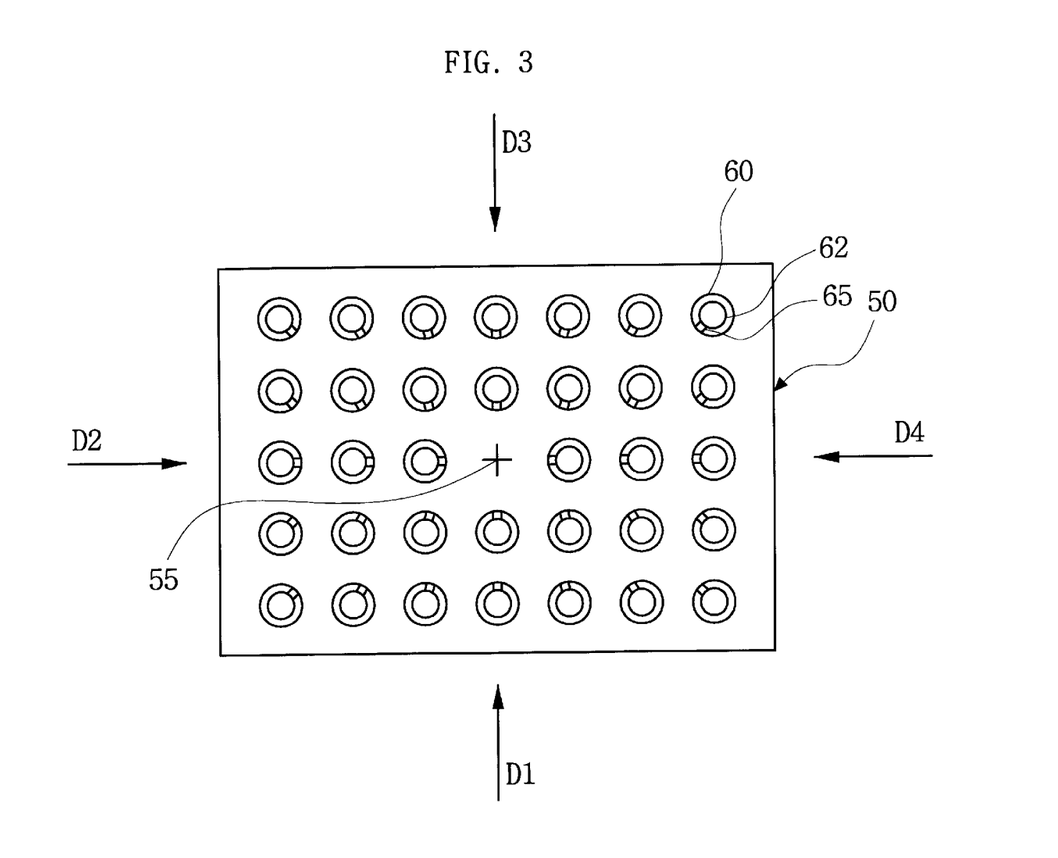
FIG. 3 is a bottom view of the BGA package showing the solder ball land pattern.

FIG. 3 is bottom view of a BGA package showing the solder ball mounting surface according to the present invention. The solder ball mounting surface is on the opposite side of the substrate 12 to the chip mounting surface. The surface of the solder ball mounting surface 50 is applied with a solder mask 52 except the ball land opening area 60. The ball lands 62 are provided within the ball land opening area 60. This structure is called Non-Solder Mask Defined (NSMD). The ball lands 62 are connected to pattern connecting portions 65.

Figure 4:
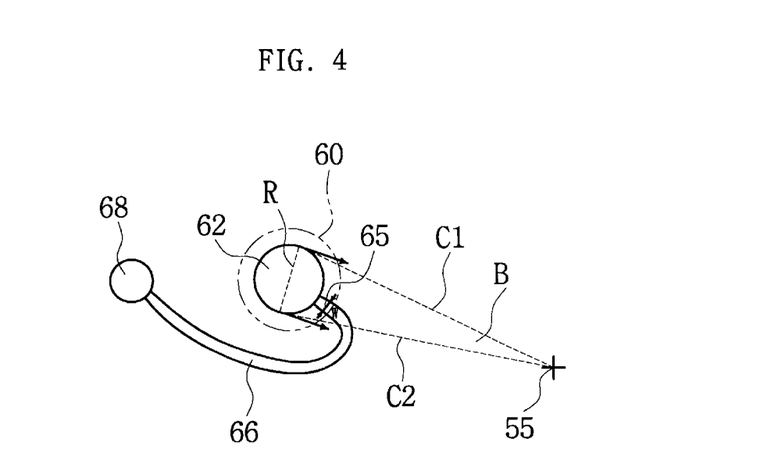
FIG. 4 is a partial enlarged view of the solder ball land pattern of the BGA package.

According to the present invention, the solder ball land type is designed so that the pattern connecting portions 65 are arranged substantially toward the center point 55 of the package. More specifically, the solder ball land type is designed so that the pattern connecting portions 65 lie within a centrally directional area B as shown in FIG. 4. The central direction area B has a shape of an isosceles triangle having a base and two oblique sides. The base is diameter R crossing the center of the ball land 62 and substantially perpendicular to a line connecting the center 55 of the solder ball mounting surface 50 with approximately the center of the ball land 62. The oblique sides are two straight lines C1 and C2 respectively connecting both ends of the base to the center 55. The pattern connecting portion 65 is formed as one body, preferably integral, with the metal wiring pattern 66 that electrically interconnects the ball land 62 and the via holes 68. It is preferable that the width W of the pattern connecting portion 65 is made smaller than the diameter R of the ball land 62.

With the design of the solder ball land as shown in FIGS. 3 and 4, the resistance to stress applied in directions D1, D2, D3 and D4 is increased, and thus the reliability of the solder joint is significantly improved.

In order to evaluate the reliability of the various solder ball joints, FIGS. 5 to 8 show four types of the solder ball land type.

Figure 5A:
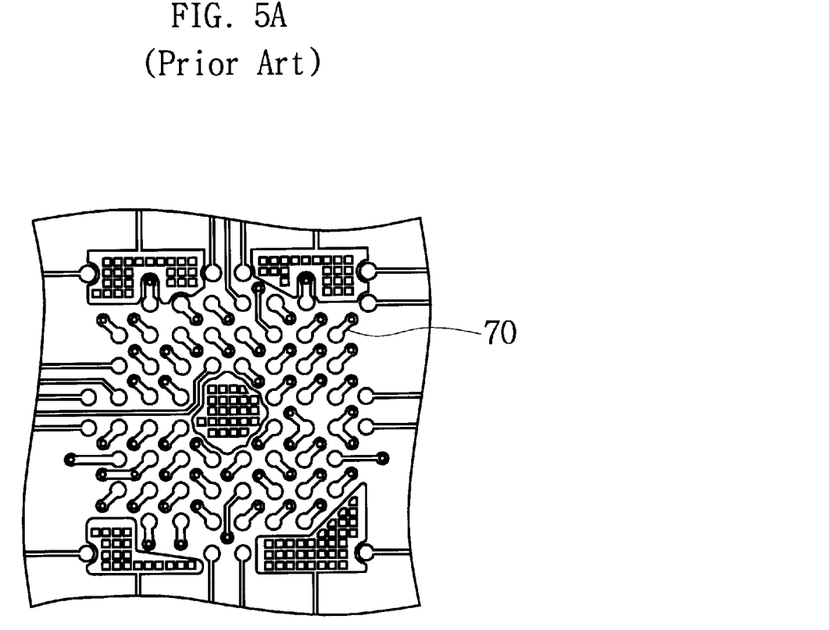
FIGS. 5a and 5b are a bottom view and a partial enlarged view respectively, of a conventional BGA package for evaluating the reliability of the solder ball joint.
Figure 5B:
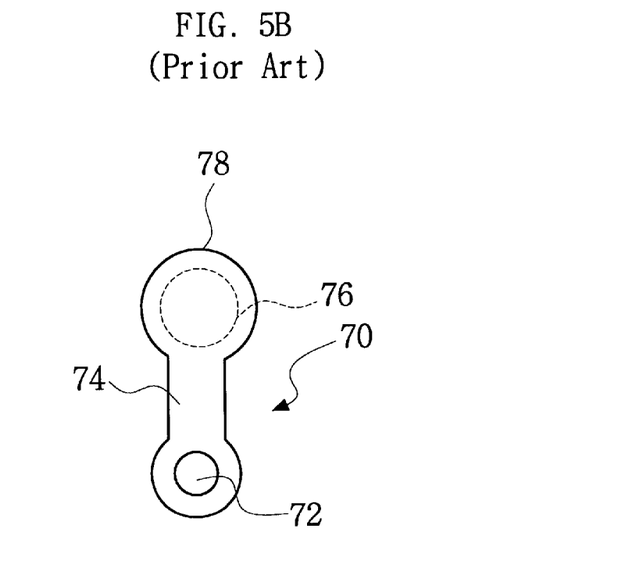

Type 1 has a pattern as shown in FIG. 5. This type of solder ball land 70 is arranged in a random fashion with no overall alignment towards the center of the package. The diameter of the ball land opening area 76 is approximately 380 microns, which is smaller than that of the ball land 78, i.e. approximately 450 microns, as shown in FIG. 5b. This is called an SMD Solder Mask Defined) structure. The width of the pattern connecting portion 74 connected to a via hole 72 is 250 microns.

Figure 6A:
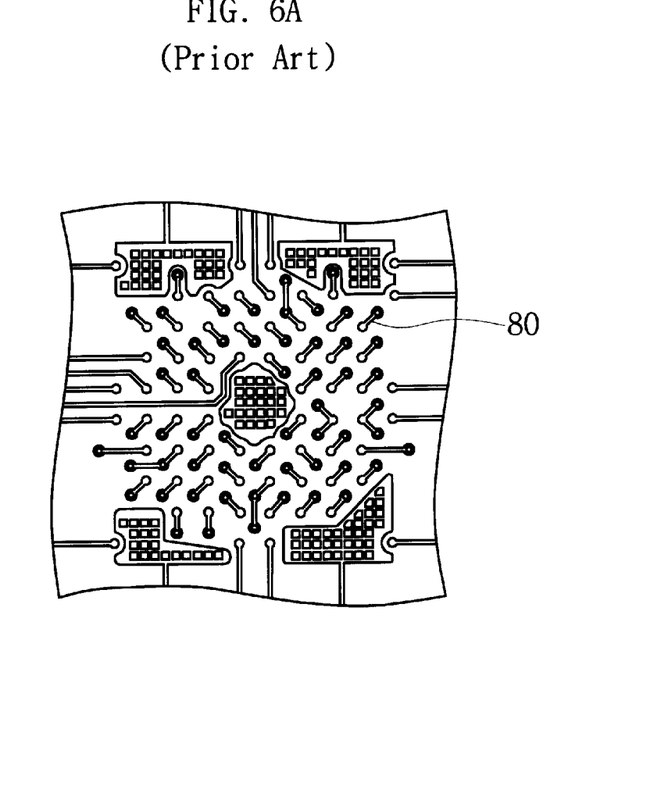
FIGS. 6a and 6b are a bottom view and a partial enlarged view respectively, of another prior art BGA package for evaluating the reliability of the solder ball joint.
Figure 6B:
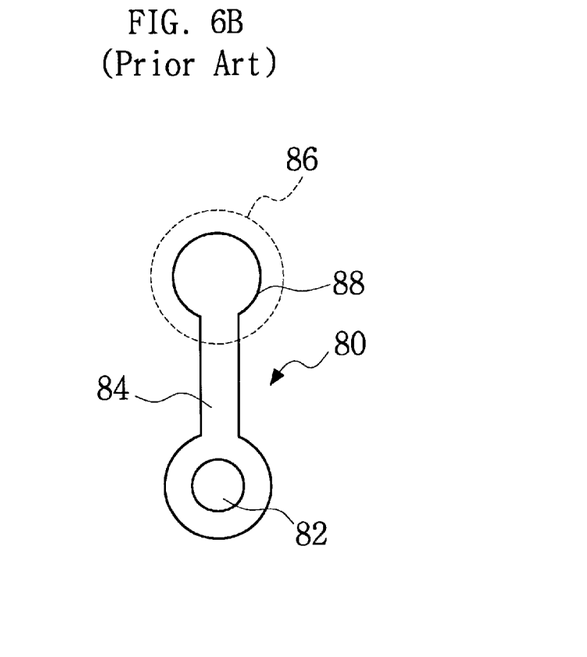

Type 2 is a NSMD structure having a non-directional solder ball land type 80 as shown in FIGS. 6a and 6b. The size of the ball land 88 is 270 microns, the size of the ball land opening area 86 is 400 microns, and the width of the pattern connecting portion 84 connected to a via hole 82 is 75 microns.

Figure 7A:
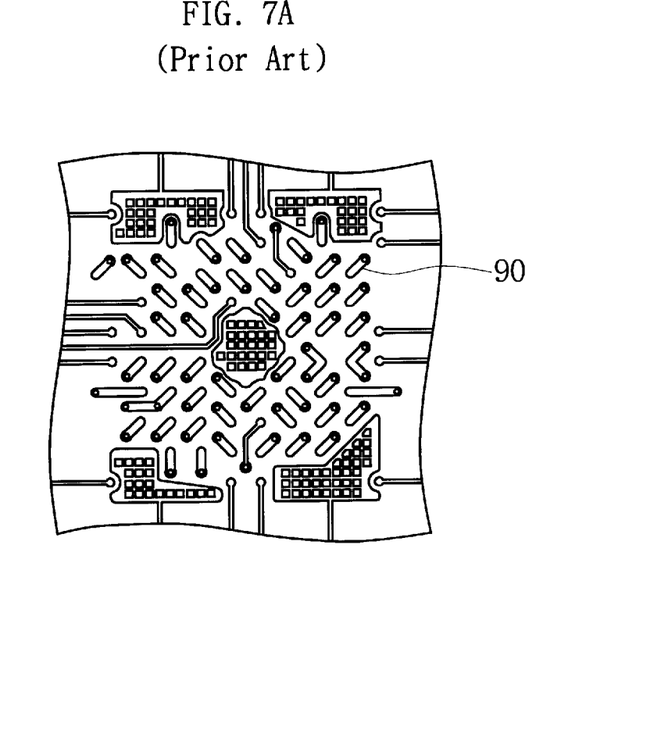
FIGS. 7a and 7b are a bottom view and a partial enlarged view respectively, of still another prior art BGA package for evaluating the reliability of the solder ball joint.
Figure 7B:
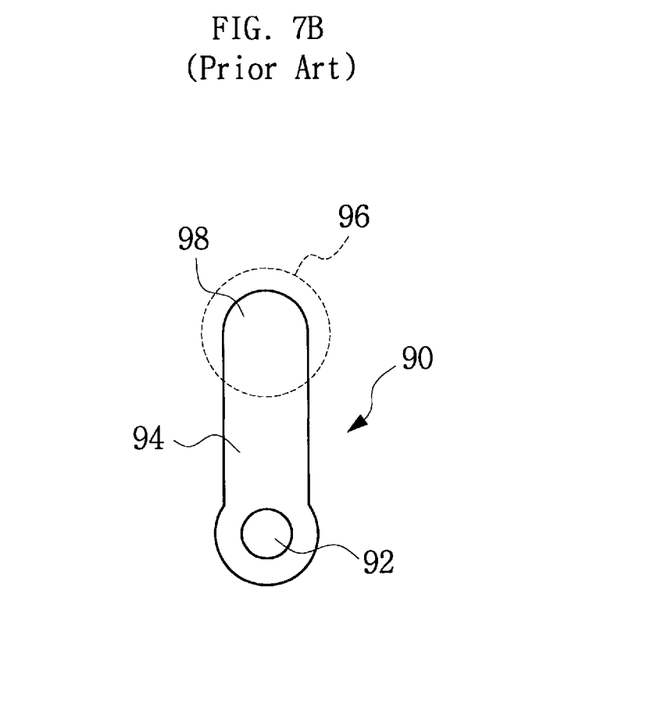

Type 3 is an NSMD structure having a non-directional solder ball land type 90 as shown in FIGS. 7a and 7b. The size of the ball land 96 is 270 microns, the size of the ball land opening area 98 is 400 microns, and the width of the pattern connecting portion 94 is 250 microns.

Figure 8A:
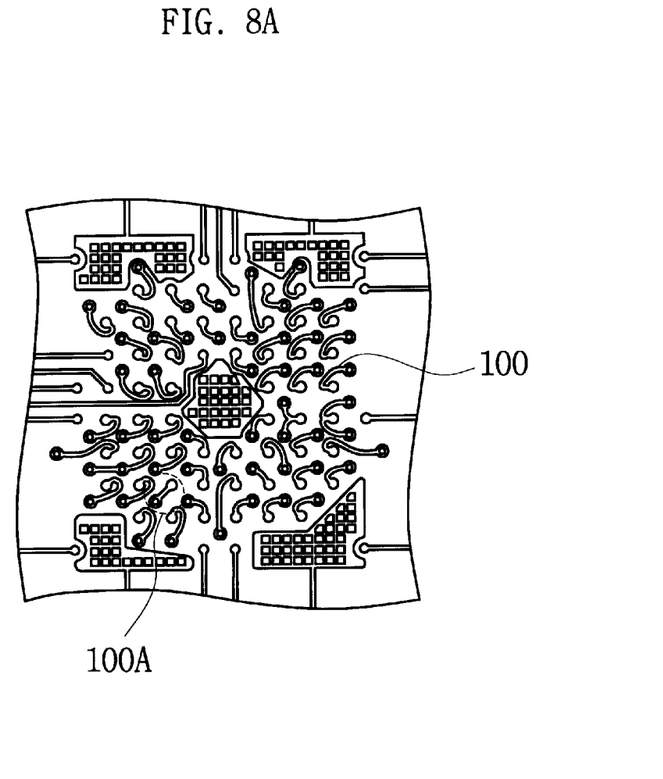
FIGS. 8a and 8b are a bottom view and a partial enlarged view respectively, of the BGA package according to the present invention for evaluating the reliability of the solder ball joint.
Figure 8B:
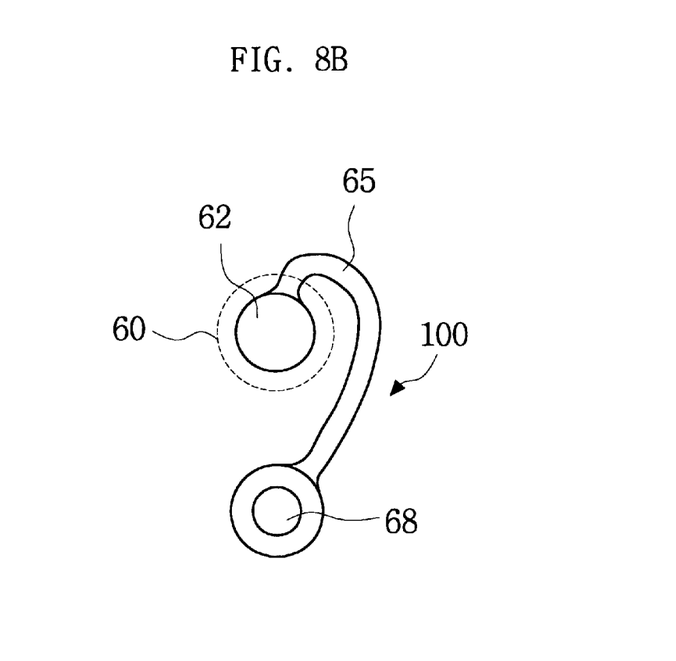

Type 4 is an NSMD structure having a solder ball land type 100 as shown in FIGS. 8a and 8b. The size of the ball land 62 is 270 microns, the size of the ball land opening area 60 is 400 microns, and the width of the pattern connecting portion 65 is 75 microns.

Upon performing thermal cycling from −25° C. to 125° C. to the four types of BGA packages listed above, the cracks in the solder ball joints were found as shown in following table 1. The thermal cycling was performed in a period of 30 minutes, and the BGA package is a multi-chip package where a synchronous DRAM device and an NOR type flash memory is integrated into one chip.

of the NSMD structure on both the side and top surfaces, and therefore the resistance to the stress is greater than in the SMD structure.

Type 3 is generally an NSMD structure, however it is not different from the SMD structure when viewed from the direction in which the maximum stress is applied to the solder ball joint in that the width of the pattern connecting portion is 250 microns, little different from the size of the ball land-270 microns. Accordingly, by comparing types 1 and 3, it is found that the solder ball joint is more reliable when the width of the pattern connecting portion is smaller.

For type 2, cracks had occurred in all samples by the completion of TC 700 as shown in table 2 below, thus it is possible to evaluate the exact reliability of the solder ball joint. When performing thermal cycling from −25° C. to 125° C. with the packages of the above four types with attached solder balls having a diameter of 0.4 mm, pattern cracks occur as shown below in table 2.

TABLE 1

Cracks in the Solder Ball Joints

|  | Number of samples | TC 300 | TC 700 | TC 1000 | TC 1200 | TC 1400 | TC 1600 |
|---|---|---|---|---|---|---|---|
| Type 1 | 180 | 0 | 0 | 0 | 0 | 2 | 1 |
| Type 2 | [180] | [0] | [Evaluation failed since all patterns failed] 180 | 0 |  | Evaluation failed since all patterns failed |  |
| Type 3 | 180 | 0 | 0 | 0 | 0 | 3 | 7 |
| Type 4 | 180 | 0 | 0 | 0 | 0 | 0 | 0 |

Comparing the results of types 1, 3 and 4, it is found that the reliability of the solder ball joint in the SMD structure is lower than in the NSMD structure. Further, the results from types 1 and 2 reveal that the width of the pattern connecting part has a great effect on the solder ball joint reliability.

In the SMD structure, the solder balls are attached onto the flat surface of the solder ball land, and crack occurs in the interfacial surface between the solder ball and the land when a predetermined amount of stress is applied. The crack progresses more speedy after the initial crack. On the other hand, since the joint is formed in a shape so that the solder ball surrounds the ball land, the stress is applied to the land

TABLE 2

Pattern Cracks

|  | Number of samples | TC 300 | TC 700 | TC 1000 | TC 1200 | TC 1400 | TC 1600 |
|---|---|---|---|---|---|---|---|
| Type 1 | 180 | 0 | 0 | 0 | 0 | 0 | 0 |
| Type 2 | 180 | 51 | 129 | — | — | — | — |
| Type 3 | 180 | 0 | 0 | 0 | 0 | 0 | 0 |
| Type 4 | 180 | 0 | 15 | 21 | 7 | 8 | 8 |

Here, it should be noted that the pattern cracks in type 4 of the present invention were found only in the solder ball land types denoted as circle 100A in FIG. 8a. The land pattern 100A does not have pattern connecting portions 65 radially aligned toward substantially the center of the package in contrast to the remaining patterns 100.

When the solder ball land types 1 and 4 are applied to packages other than the above multi-chip package, solder ball joint cracks occur as shown in below table 3.

TABLE 3

| | Number of samples | TC 300 | TC 700 | TC 1000 | TC 1200 | TC 1400 | TC 1600 |
|---|---|---|---|---|---|---|---|
| | | Solder ball joint cracks | | | | | |
| Type 1 | 180 | 0 | 1 | 0 | 126 | — | — |
| Type 4 | 180 | 0 | 0 | 0 | 0 | 0 | 0 |

The relationship between the material of the solder ball and the reliability of the solder ball joint is shown in table 4 below. Here, material 1 represents eutectic solder ball having tin and lead in amounts of 63% and 37%, respectively. Material 2 has additional amounts of copper.

TABLE 4

| | Number of samples | TC 300 | TC 700 | TC 1000 | TC 1200 | TC 1400 | TC 1600 |
|---|---|---|---|---|---|---|---|
| Material 1 | 180 | 0 | 1 | 20 | — | — | — |
| Material 2 | 180 | 0 | 0 | 0 | 0 | 2 | 1 |

As shown in table 4, when the copper is added, the solder ball joint is more reliable.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A ball grid array (BGA) package including a circuit board having a chip mounting surface where a semiconductor chip is mounted and wiring patterns are formed, and a solder ball mounting surface to which a plurality of solder balls electrically interconnected to the wiring patterns are mounted, said circuit board comprises:
    ball lands connected to the solder balls;
    solder ball opening areas defined in a solder mask formed on the solder ball mounting surface, and exposing the ball lands through the solder mask;
    pattern connecting portions connected to the ball lands; and
    conductive wiring patterns connected with the pattern connecting portions and electrically interconnected to the solder balls,
    wherein said pattern connecting portions are aligned radially inwardly, starting from the ball lands, toward substantially a center point of the solder ball mounting surface.

2. The ball grid array package as claimed in claim 1, wherein the width of the pattern connecting portions is smaller than the size of the ball land.

3. The ball grid array package as claimed in claim 1, wherein substantially every one of the pattern connecting portions is connected to the corresponding one of the ball lands within an isosceles triangle comprising a base and two sides, the base crossing the center of the ball lands and substantially perpendicular to a line connecting the center of the solder ball mounting surface with the center of the ball land.

4. The ball grid array package as claimed in claim 1, wherein the solder ball is made of tin-lead alloy including copper.

5. The ball grid array package as claimed in claim 1, wherein the ball land opening area is larger than the ball land.

6. The ball grid array package as claimed in claim 5, wherein the width of the pattern connecting portions is smaller than the size of the ball land.

7. The ball grid array package as claimed in claim 5, wherein substantially every one of the pattern connecting portions is connected to the corresponding one of the ball lands within an isosceles triangle comprising a base and two sides, the base crossing the center of the ball lands and substantially perpendicular to a line connecting the center of the solder ball mounting surface with the center of the ball land.

8. The ball grid array package as claimed in claim 5, wherein the solder ball is made of tin-lead alloy including copper.

9. A circuit board on which a semiconductor chip is mounted and having a chip mounting surface in which wiring patterns are formed and a solder ball mounting surface in which a plurality of solder balls are mounted and electrically interconnected to the wiring patterns, comprises:
    a plurality of ball lands each directly connected to the respective one of the plurality of solder balls;
    solder ball opening areas defined by a solder ball mask deposited on the solder ball mounting surface, and exposing the ball land through the solder ball mask;
    a plurality of pattern connecting portions each connected to corresponding one of the ball lands; and
    conductive wiring patterns connected with the pattern connecting portions and electrically interconnected to the solder balls,
    wherein said plurality of pattern connecting portions are aligned radially inwardly, starting from the ball lands, toward a substantially center point of the solder ball mounting surface.

10. The circuit board as claimed in claim 9, wherein the width of the pattern connecting portions is smaller than the size of the ball land.

11. The circuit board as claimed in claim 9, wherein substantially every one of the pattern connecting portions is connected to the corresponding one of the ball lands within an isosceles triangle comprising a base and two sides, the base crossing the center of the ball lands and substantially perpendicular to a line connecting the center of the solder ball mounting surface with the center of the ball land.

12. The circuit board as claimed in claim 9, wherein the solder ball opening area is larger than the size of the ball land.

13. The circuit board as claimed in claim 12, wherein the width of the pattern connecting portions is smaller than the size of the ball land.

14. The circuit board as claimed in claim 12, wherein substantially every one of the pattern connecting portions is connected to the corresponding one of the ball lands within an isosceles triangle comprising a base and two sides, the base crossing the center of the ball lands and substantially perpendicular to a line connecting the center of the solder ball mounting surface with the center of the ball land.

15. A circuit board having a chip mounting surface and an interconnection ball mounting surface, comprising:

interconnection ball lands formed on the interconnection ball mounting surface;

a mask of a dielectric material formed on the interconnection ball mounting surface, the mask having interconnection ball opening areas defined therein, and exposing the ball lands through the mask;

pattern connecting portions electrically connected to the ball lands; and conductive wiring patterns connected with the pattern connecting portions, wherein said plurality of pattern connecting portions are aligned inwardly radially toward substantially a center point of the interconnection ball mounting surface.

16. The circuit board as claimed in claim 15, wherein said mask comprises a solder mask.

\* \* \* \* \*

UNITED STATES PATENT AND TRADEMARK OFFICE
CERTIFICATE OF CORRECTION

PATENT NO.   : 6,441,493 B1
DATED        : August 27, 2002
INVENTOR(S)  : Hyeong-Scob Kim It is certified that error appears in the above-identified patent and that said Letters Patent is hereby corrected as shown below:

Column 10,
Line 16, "radially toward" should be -- radially, starting from the ball lands, toward --.

Signed and Sealed this

Twelfth Day of November, 2002

Attest:

JAMES E. ROGAN
Attesting Officer    Director of the United States Patent and Trademark Office